(12) United States Patent
Song

(10) Patent No.: US 10,807,474 B2
(45) Date of Patent: Oct. 20, 2020

(54) DRIVING CIRCUIT FOR ELECTRIC VEHICLE AND CONTROL METHOD THEREOF

(71) Applicant: LG CHEM, LTD., Seoul (KR)

(72) Inventor: Jeong-Joo Song, Daejeon (KR)

(73) Assignee: LG CHEM, LTD., Seoul (KR)

( * ) Notice: Subject to any disclaimer, the term of this patent is extended or adjusted under 35 U.S.C. 154(b) by 189 days.

(21) Appl. No.: 15/765,626

(22) PCT Filed: May 16, 2017

(86) PCT No.: PCT/KR2017/005064
§ 371 (c)(1),
(2) Date: Apr. 3, 2018

(87) PCT Pub. No.: WO2017/222186
PCT Pub. Date: Dec. 28, 2017

(65) Prior Publication Data
US 2019/0077267 A1     Mar. 14, 2019

(30) Foreign Application Priority Data

Jun. 22, 2016   (KR) .......................... 10-2016-0078193

(51) Int. Cl.
*B60L 3/06*     (2006.01)
*G01R 19/165*   (2006.01)
(Continued)

(52) U.S. Cl.
CPC ............. *B60L 3/06* (2013.01); *B60L 3/0069* (2013.01); *B60L 3/0092* (2013.01); *B60L 3/04* (2013.01);
(Continued)

(58) Field of Classification Search
CPC .... B60L 3/06; B60L 50/50; B60L 3/04; B60L 3/0092; B60L 2270/20; B60L 53/53;
(Continued)

(56) References Cited

U.S. PATENT DOCUMENTS 5,408,842 A  *  4/1995  Goto ................. B60H 1/00978
                                                  318/801
6,768,621 B2 *  7/2004  Arnet ..................... H02H 9/001
                                                   361/93.1
(Continued)

FOREIGN PATENT DOCUMENTS

CN         101073990 A      11/2007
EP           2774798 A2      9/2014
(Continued)

OTHER PUBLICATIONS

Written Opinion of the International Searching Authority, dated Aug. 8, 2017, for International Application No. PCT/KR2017/005064.

(Continued)

*Primary Examiner* — Rexford N Barnie
*Assistant Examiner* — Terrence R Willoughby
(74) *Attorney, Agent, or Firm* — Birch, Stewart, Kolasch & Birch, LLP

(57) ABSTRACT

Disclosed is a driving circuit for an electric vehicle having a battery pack and an inverter, and a control method thereof. The driving circuit includes a first contactor connected between a first terminal of the battery pack and a first terminal of a capacitor included in the inverter, a second contactor and a current limiting circuit connected to the first contactor in parallel, and a control unit configured to control operations of the first contactor and the second contactor. The second contactor and the current limiting circuit are connected to each other in series. The current limiting circuit (Continued)

includes at least one resistor, wherein the control unit outputs a first control signal when the first contactor is normally operating and outputs a second control signal when the first contactor is abnormally operating. The first control signal induces the first contactor to turn on, and the second control signal induces the second contactor to turn on.

13 Claims, 4 Drawing Sheets

(51) Int. Cl.
- *B60L 3/00* (2019.01)
- *H02J 7/34* (2006.01)
- *B60L 53/20* (2019.01)
- *B60L 58/21* (2019.01)
- *G01R 31/00* (2006.01)
- *G01R 31/36* (2020.01)
- *B60L 3/04* (2006.01)
- *B60L 50/50* (2019.01)

(52) U.S. Cl.
CPC .............. *B60L 50/50* (2019.02); *B60L 53/20* (2019.02); *B60L 58/21* (2019.02); *G01R 19/165* (2013.01); *G01R 19/16542* (2013.01); *G01R 31/00* (2013.01); *G01R 31/36* (2013.01); *H02J 7/345* (2013.01); *B60L 2270/20* (2013.01); *Y02T 10/7005* (2013.01); *Y02T 10/7022* (2013.01); *Y02T 10/7241* (2013.01)

(58) Field of Classification Search
CPC ...... B60L 53/55; B60L 2240/12; B60L 58/10; G01R 31/36; G01R 31/00; G01R 19/165; G01R 19/16542; G01R 31/006; G01R 31/364; H02J 7/345; B60Y 2200/91; H01M 10/48
See application file for complete search history.

(56) References Cited

U.S. PATENT DOCUMENTS

| | | | | |
|---|---|---|---|---|
| 8,264,201 | B2* | 9/2012 | Tae | H02J 7/0014 320/118 |
| 9,069,044 | B2* | 6/2015 | Tae | G01R 31/3278 |
| 2004/0061503 | A1* | 4/2004 | Morimoto | B60K 6/28 324/418 |
| 2010/0207635 | A1 | 8/2010 | Plagens et al. | |
| 2010/0244558 | A1 | 9/2010 | Mitsutani et al. | |
| 2010/0244847 | A1* | 9/2010 | Kudo | B60L 3/0046 324/433 |
| 2010/0247988 | A1* | 9/2010 | Okumura | B60L 50/16 429/90 |
| 2010/0277845 | A1* | 11/2010 | Park | H02H 9/001 361/87 |
| 2011/0049977 | A1* | 3/2011 | Onnerud | B60L 3/0046 307/9.1 |
| 2011/0073714 | A1* | 3/2011 | Hruby | B64G 1/405 244/171.1 |
| 2011/0184677 | A1* | 7/2011 | Tae | G01R 31/396 702/63 |
| 2011/0298424 | A1* | 12/2011 | Yamauchi | B60L 3/0046 320/118 |
| 2012/0251866 | A1* | 10/2012 | Matejek | B60L 3/0046 429/123 |
| 2013/0116875 | A1* | 5/2013 | Oh | B60L 15/2045 701/22 |
| 2014/0001836 | A1 | 1/2014 | Basheer | |
| 2014/0021916 | A1* | 1/2014 | Bilezikjian | B60L 3/04 320/109 |
| 2014/0028088 | A1* | 1/2014 | Salziger | B60R 16/02 307/9.1 |
| 2015/0035539 | A1* | 2/2015 | Wakida | G01R 31/327 324/418 |
| 2015/0084404 | A1* | 3/2015 | Hashim | B60L 50/50 307/9.1 |
| 2015/0155732 | A1* | 6/2015 | McCormick | H02J 7/0052 318/139 |
| 2015/0180400 | A1* | 6/2015 | Bober | H02P 27/04 318/503 |
| 2015/0185271 | A1* | 7/2015 | Kim | G01R 31/028 324/551 |
| 2015/0207438 | A1 | 7/2015 | Takami et al. | |
| 2015/0270735 | A1 | 9/2015 | Smith | |
| 2016/0023559 | A1* | 1/2016 | Cho | B60L 11/18 318/139 |
| 2018/0024196 | A1* | 1/2018 | Imura | H02H 1/0007 324/762.01 |

FOREIGN PATENT DOCUMENTS

| | | |
|---|---|---|
| JP | 3555534 B2 | 8/2004 |
| JP | 2006-81340 A | 3/2006 |
| JP | 2006-136095 A | 5/2006 |
| JP | 2006-314172 A | 11/2006 |
| JP | 2007-282359 A | 10/2007 |
| JP | 2009-148139 A | 7/2009 |
| JP | 2009-163597 A | 7/2009 |
| JP | 2015-33233 A | 2/2015 |
| KR | 10-0694062 B1 | 3/2007 |
| KR | 10-2008-0087487 A | 10/2008 |
| KR | 10-2010-0082507 A | 7/2010 |
| KR | 10-2014-0039167 A | 4/2014 |
| KR | 10-2014-0070148 A | 6/2014 |
| KR | 10-2014-0078946 A | 6/2014 |
| KR | 10-2015-0027510 A | 3/2015 |
| KR | 10-2015-0087801 A | 7/2015 |
| KR | 10-2015-0110328 A | 10/2015 |
| WO | WO 2014/134218 A1 | 9/2014 |

OTHER PUBLICATIONS

International Search Report (PCT/ISA/210) issued in PCT/KR2017/005064, dated Aug. 8, 2017.

\* cited by examiner

DRIVING CIRCUIT FOR ELECTRIC VEHICLE AND CONTROL METHOD THEREOF

TECHNICAL FIELD

The present disclosure relates to a driving circuit for an electric vehicle and a control method thereof, and more particularly, to a driving circuit for emergency driving of an electric vehicle and a control method thereof.

The present application claims priority to Korean Patent Application No. 10-2016-0078193 filed on Jun. 22, 2016 in the Republic of Korea, the disclosures of which are incorporated herein by reference.

BACKGROUND ART

In recent years, demand for portable electronic products such as notebook computers, video cameras, portable telephones and the like has been drastically increased and electric vehicles, storage batteries for energy storage, robots, satellites and the like have been actively developed. For this reason, high performance secondary batteries capable of repeated charge and discharge have been actively studied.

Lithium secondary batteries currently commercially available include nickel-cadmium batteries, nickel-hydrogen batteries, nickel-zinc batteries and lithium secondary batteries. Among them, the lithium secondary batteries are in the spotlight because they have almost no memory effect compared to nickel-based secondary batteries, and thus perform charge and discharge freely, have very low self-discharge rate and have high energy density.

A secondary battery is attracting attention as a new energy source for improving environment-friendliness and energy efficiency in that it has not only a primary advantage of greatly reducing the use of fossil fuels but also a secondary advantage of generating no by-products due to the use of energy.

Korean Unexamined Patent Publication No. 10-2015-0027510 (hereinafter, referred to as a conventional literature) discloses such a secondary battery as a conventional art. FIG. 1 is a schematic view showing an electric vehicle disclosed in the conventional literature.

Referring to FIG. 1, an electric vehicle 10 includes a pre-charge and voltage supply system 30, a DC-AC inverter 40, a vehicle motor system 50, a vehicle controller 52 and the like. The system 30 includes a first battery 60, a voltage sensor 70, a contactor 80, a contactor driver 90, a voltage sensor 110, a DC-DC voltage converter 120 and a second battery 130. The first battery 60 is configured to supply power for driving the vehicle motor system 50. The second battery 130 is configured to supply power for pre-charging a capacitor in the DC-AC inverter 40.

However, the electric vehicle 10 disclosed in the conventional literature essentially includes the second battery 130 for pre-charging a capacitor in the DC-AC inverter 40, which increases the cost and limits the space. Moreover, the conventional literature fails to suggest a technique for emergency control of the electric vehicle 10 while the contactor 80 is abnormally operating.

DISCLOSURE

Technical Problem

The present disclosure is designed to solve the problems of the related art, and therefore the present disclosure is directed to providing a driving circuit for not only pre-charging a capacitor in an inverter but also performing emergency driving, by using a single battery provided in an electric vehicle, and a control method thereof.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a driving circuit for an electric vehicle having a battery pack and an inverter, the driving circuit comprising: a first contactor connected between a first terminal of the battery pack and a first terminal of a capacitor included in the inverter; a second contactor and a current limiting circuit connected to the first contactor in parallel; and a control unit configured to control operations of the first contactor and the second contactor, wherein the second contactor and the current limiting circuit are connected to each other in series, wherein the current limiting circuit includes at least one resistor, wherein the control unit outputs a first control signal when the first contactor is normally operating and outputs a second control signal when the first contactor is abnormally operating, and wherein the first control signal induces the first contactor to turn on, and the second control signal induces the second contactor to turn on.

In addition, the driving circuit may further comprise a third contactor connected between a second terminal of the battery pack and a second terminal of the capacitor. The control unit may output a third control signal together with the second control signal when the first contactor is normally operating. The third control signal may induce the third contactor to turn on.

In addition, the control unit may stop outputting the first control signal when the first contactor is abnormally operating.

In addition, the driving circuit may further comprise a voltage measuring circuit configured to measure voltages at both ends of the first contactor.

In addition, the control unit may determine whether the first contactor is normally operating, based on the voltages at both ends of the first contactor measured by the voltage measuring circuit, while the first control signal is being output.

In addition, the current limiting circuit may include a first current limiting unit connected to the second contactor in series; and a second current limiting unit connected to the first current limiting unit in parallel. The first current limiting unit may include a first switch and a first resistor connected to each other in series. The second current limiting unit may include a second switch and a second resistor connected to each other in series. In this case, resistance of the first resistor may be different from resistance of the second resistor.

In addition, the control unit may turn on at least one of the first switch and the second switch when the first contactor is abnormally operating.

In addition, the control unit may turn on at least one of the first switch and the second switch based on running information of the electric vehicle.

In addition, the running information may include at least one of running speed, geographic position and body inclination of the electric vehicle.

In addition, the control unit may output a fourth control signal together with the second control signal when resistance of the first resistor is greater than resistance of the second resistor and the running speed is lower than a reference speed when the first contactor is abnormally operating. The first switch may turn on by the fourth control signal.

In addition, the control unit may output a fifth control signal together with the second control signal when resistance of the first resistor is greater than resistance of the second resistor and the running speed is equal to or higher than a reference speed when the first contactor is abnormally operating. The second switch may turn on by the fifth control signal.

In another aspect of the present disclosure, there is provided an electric vehicle comprising the driving circuit.

In another aspect of the present disclosure, there is provided a control method comprising: by the control unit, outputting a first control signal; by the control unit, determining whether the first contactor is normally operating while the first control signal is being output; by the control unit, outputting the second control signal while it is determined that the first contactor is abnormally operating; and turning on the second contactor by the second control signal to electrically connect the first terminal of the battery pack and the first terminal of the capacitor.

Advantageous Effects

According to an embodiment of the present disclosure, the driving circuit may not only pre-charge a capacitor in an inverter but also perform emergency driving, by using a single battery provided in an electric vehicle. In particular, during the emergency driving, the magnitude of current supplied from a battery pack to an electric motor may be adjusted based on running information of the electric vehicle.

The effects of the present disclosure are not limited to the above, and effects not mentioned herein may be clearly understood by those skilled in the art from the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is judged that detailed explanation on a known technique or configuration may unnecessarily make the essence of the present disclosure vague, the detailed explanation will be omitted.

Throughout the specification, when a portion is referred to as "comprising" or "including" any element, it means that the portion may include other elements further, not excluding other elements unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a driving circuit 10 according to embodiments of the present disclosure will be described in detail with reference to FIGS. 2 to 6.

Figure 1:
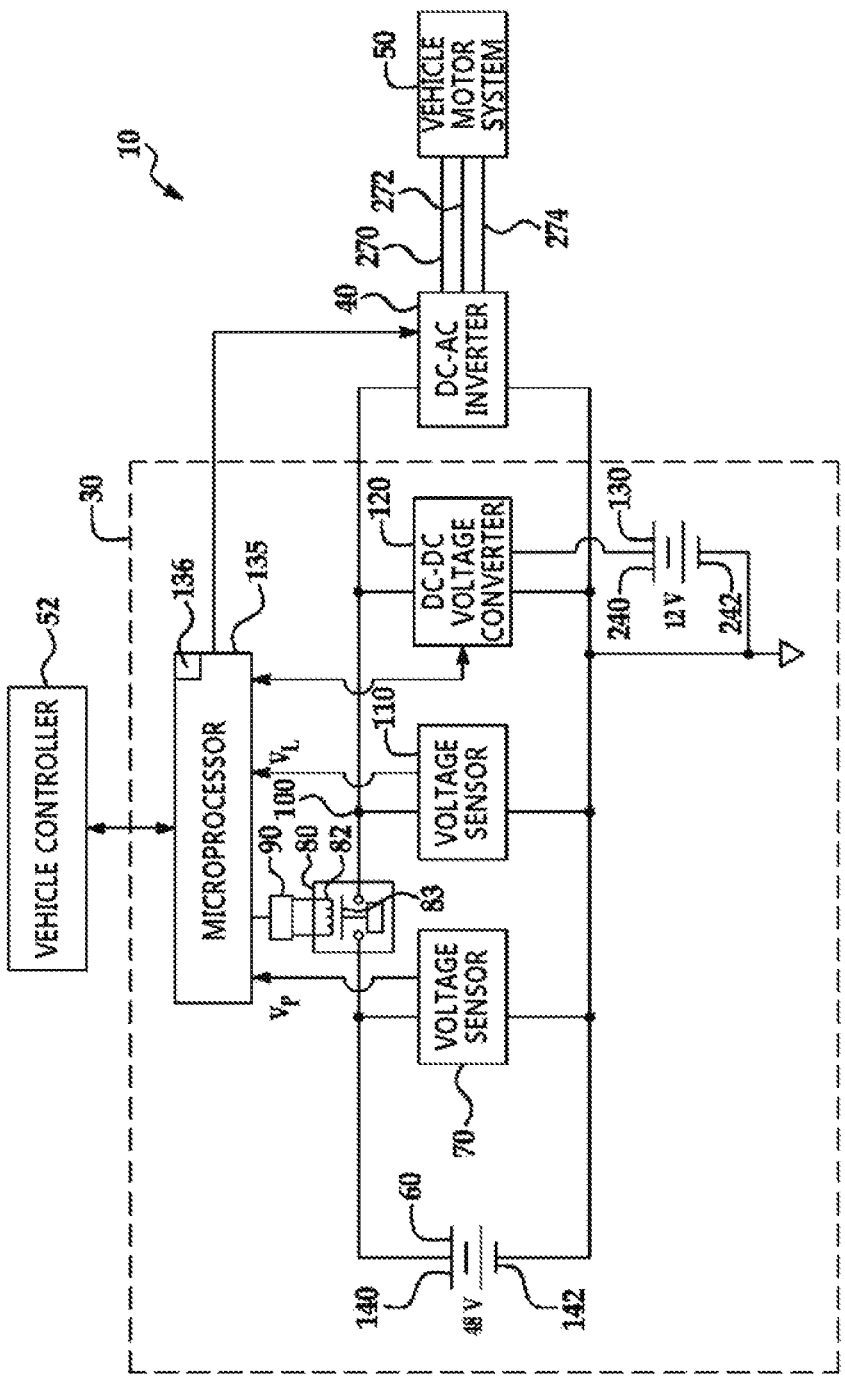
FIG. 1 is a schematic view showing an electric vehicle disclosed in a conventional literature.
Figure 2:
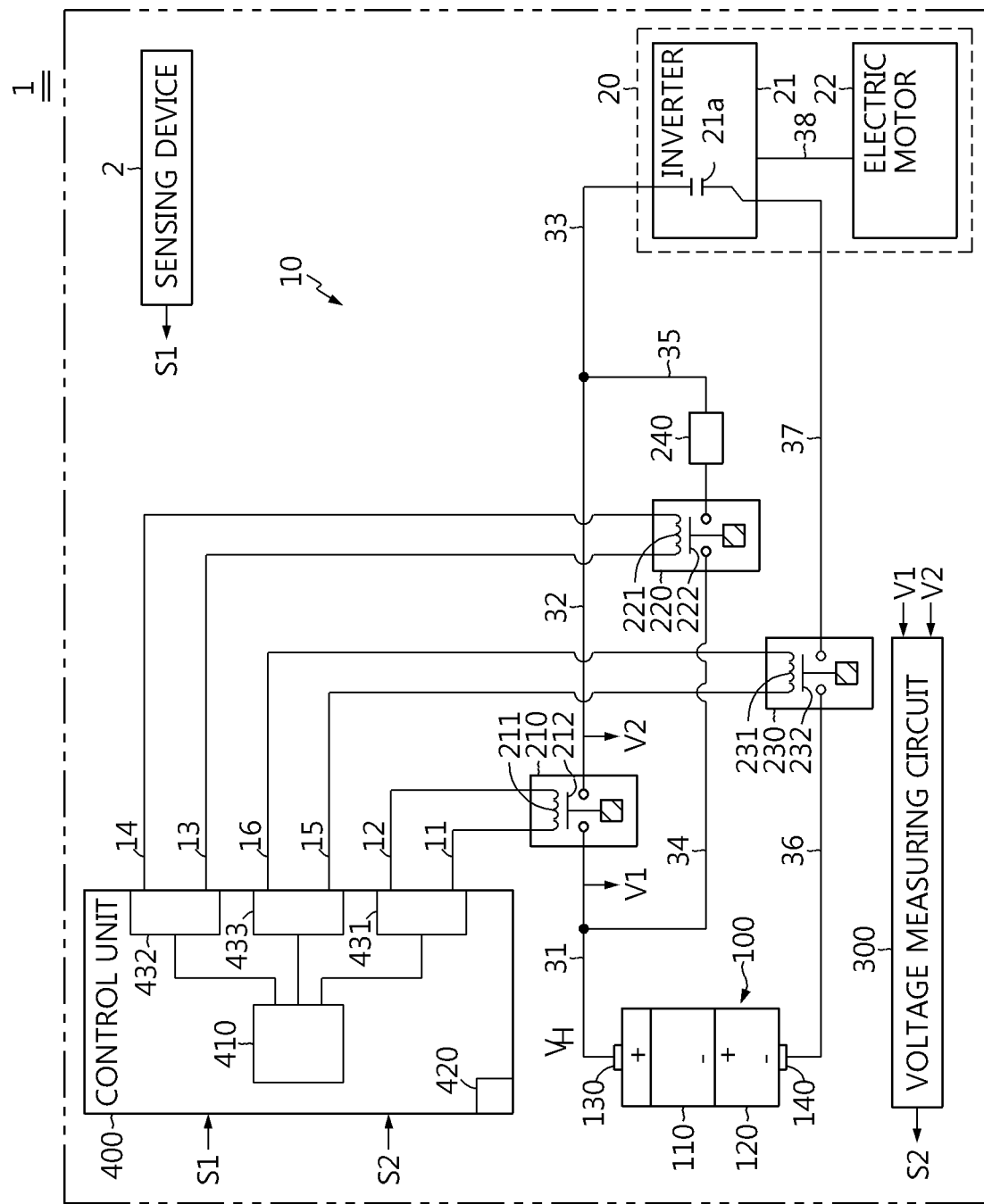
FIG. 2 is a block diagram showing a functional configuration of an electric vehicle having a driving circuit according to an embodiment of the present disclosure.

FIG. 2 is a block diagram showing a functional configuration of an electric vehicle 1 having the driving circuit 10 according to an embodiment of the present disclosure.

Referring to FIG. 2, the electric vehicle 1 may include a sensing device 2, a battery pack 100, a driving circuit 10, a load 20, voltage output lines 11 to 16 and electric lines 31 to 38.

In addition, the driving circuit 10 may include a first contactor 210, a second contactor 220, a third contactor 230, a current limiting circuit 240, a voltage measuring circuit 300 and a control unit 400. In an embodiment, at least one of the first contactor 210, the second contactor 220 and the third contactor 230 may also be included in the electric vehicle 1, instead of the driving circuit 10.

The battery pack 100 is configured to output an operational voltage $V_H$ of a predetermined range in order to operate the load 20. As shown in the figures, the battery pack 100 may include a plurality of battery modules 110, 120 electrically connected to each other in series. At this time, each of the battery modules 110, 120 may be configured to include at least one unit cell.

The load 20 may include an inverter 21 and an electric motor 22. After a capacitor 21a is completely pre-charged, while the connectors 212, 232 are simultaneously at a closed operational position, a first terminal and a second terminal of the inverter 21 may be electrically connected to a first terminal 130 and a second terminal 140 of the battery pack 100, respectively. Accordingly, the inverter 21 may supply an operational voltage of a predetermined range to the electric motor 22 through an electric line 38. For example, the inverter 21 may convert a DC voltage supplied from the battery pack 100 into an AC voltage and then supply the AC voltage to the electric motor 22. The pre-charge operation for the capacitor 21a will be described later.

The sensing device 2 includes a plurality of sensors for measuring or calculating different parameters. In addition, the sensing device 2 may transmit a signal S1, which represents a measurement value collected by the sensors included therein, to the control unit 400.

Preferably, the sensing device 2 may include at least one of a speed sensor, a position sensor and an inclination sensor. The speed sensor may measure a running speed of the electric vehicle 1 and provide a signal representing the measured running speed to the control unit 400. The position sensor may provide a signal corresponding to the geographic position of the electric vehicle 1 to the control unit 400. For example, the position sensor may be a GPS receiver. The inclination sensor may provide a signal representing the body inclination of the electric vehicle 1 to the control unit 400. The information provided from the sensing device 2 to the control unit 400 may be called 'running information'.

In other words, the running information may include information about the running speed, the geographic position or the body inclination of the electric vehicle 1, and the signal S1 representing the running information may be received by the control unit 400 and utilized to control the driving circuit 10.

The control unit 400 controls overall operations of the driving circuit 10. In particular, the control unit 400 is configured to control at least one operational position of the first contactor 210, the second contactor 220 and the third contactor 230. The control unit 400 may include a microprocessor 410, a memory 420 and at least three voltage output units 431 to 433.

The microprocessor 410 may be implemented in hardware by using at least one of application specific integrated circuits (ASICs), digital signal processors (DSPs), digital signal processing devices (DSPDs), programmable logic devices (PLDs), field programmable gate arrays (FPGAs), processors, micro-controllers, and other electronic units for performing other functions.

Figure 4:
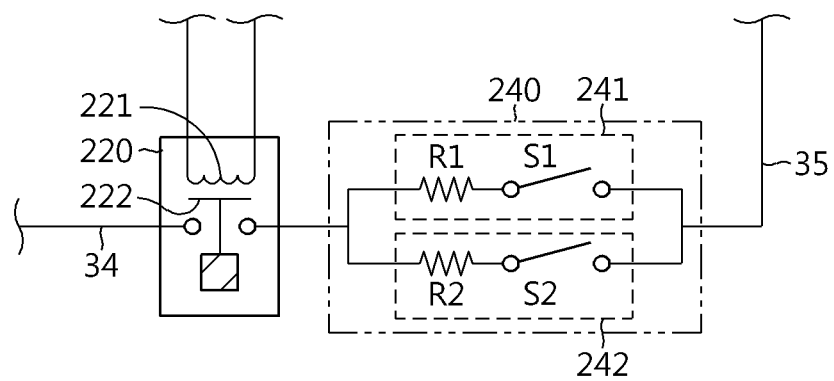
FIG. 4 is a schematic view showing a current limiting circuit according to another embodiment of the present disclosure.

In an embodiment, the microprocessor 410 may control operations of the voltage measuring circuit 300. As shown in FIG. 4, if the current limiting circuit 240 includes a switching element, the microprocessor 410 may control operations of the switching elements included in the current limiting circuit 240 individually.

The memory 420 may store various data and commands required for the overall operations of the driving circuit 10. With reference to data and commands stored in the memory 420, the microprocessor 410 may output signals for controlling operational positions of the first contactor 210, the second contactor 220 and the third contactor 230 or execute processes for determining whether the first contactor 210, the second contactor 220 and the third contactor 230 operate normally.

For example, the memory may include a storage medium of at least one of a flash memory type, a hard disk type, a solid state disk (SSD) type, a silicon disk drive (SDD) type, a multimedia card micro type, a random access memory (RAM) type, a static random access memory (SRAM) type, a read-only memory (ROM) type, an electrically erasable programmable read-only memory (EEPROM) type, and a programmable read-only memory (PROM).

The first voltage output unit 431 may output a voltage of a predetermined level to the first voltage output line 11 and the second voltage output line 12, as a response to the signal provided from the microprocessor 410. For example, the first voltage output unit 431 may output a voltage of a first level to the first voltage output line 11 and output a voltage of a second level to the second voltage output line 12.

The second voltage output unit 432 may output a voltage of a predetermined level to the third voltage output line 13 and the fourth voltage output line 14, as a response to the signal provided from the microprocessor 410. For example, the second voltage output unit 432 may output a voltage of a third level to the third voltage output line 13 and output a voltage of a fourth level to the fourth voltage output line 14.

The third voltage output unit 433 may output a voltage of a predetermined level to the fifth voltage output line 15 and the sixth voltage output line 16, as a response to the signal provided from the microprocessor 410. For example, the third voltage output unit 433 may output a voltage of a fifth level to the fifth voltage output line 15 and output a voltage of a sixth level to the sixth voltage output line 16.

The first contactor 210 may include a first contactor coil 211 and a first connector 212. The first contactor 210 may be electrically connected to the battery pack 100 and the load 20.

In detail, the first contactor 210 may be connected in series between the first terminal 130 of the battery pack 100 and the first terminal of the capacitor 21a. At this time, the first terminal 130 of the battery pack 100 may be a terminal 130 having a relatively higher potential, between both terminals 130, 140 of the battery pack 100.

The first terminal 130 of the battery pack 100 may be connected to one end of the first connector 212 through the electric line 31. In addition, the other end of the first connector 212 may be electrically connected to the first terminal of the capacitor 21a through the electric line 32.

One end of the first contactor coil 211 may be electrically connected to the first voltage output line 11, and the other end of the first contactor coil 211 may be electrically connected to the second voltage output line 12.

The control unit 400 may output a first control signal to turn on the first contactor 210. In other words, the first control signal induces the first contactor 210 to turn on. The first control signal may be provided to the first contactor coil 211 through the first voltage output line 11 and the second voltage output line 12. In detail, the control unit 400 may output a voltage of a predetermined level to the first voltage output line 11 and the second voltage output line 12, respectively to apply power to the first contactor coil 211. At this time, the level of the voltage output to one end of the first contactor coil 211 through the first voltage output line 11 may be different from the level of the voltage output to the other end of the first contactor coil 211 through the second voltage output line 12. Due to the current flowing through the first contactor coil 211 to which power is applied, the first connector 212 comes to a closed operational position. While the first connector 212 is at the closed operational position, the battery pack 100 and the load 20 may be electrically connected.

The control unit 400 may cut the power supply to the first contactor coil 211 by stopping the output of voltage to at least one of the first voltage output line 11 and the second voltage output line 12. If the power supply to the first contactor coil 211 is cut, the first connector 212 comes to an open operational position. While the first connector 212 is at the open operational position, the battery pack 100 and the load 20 may be electrically disconnected.

Meanwhile, the first contactor 210 may also be called a 'main contactor'.

The second contactor 220 may include a second contactor coil 221 and a second connector 222. The second contactor 220 may be electrically connected to the first contactor 210 in parallel, together with the current limiting circuit 240 connected there to in series.

In detail, one end of the second connector 222 may be electrically connected to the electric line 31 through the electric line 34. In addition, the other end of the second connector 222 may be electrically connected to the electric line 32 through the current limiting circuit 240 and the electric line 35. Each resistor included in the current limiting circuit 240 may be called a 'pre-charge resistor'. For example, if the current limiting circuit 240 includes two resistors, any one of them may be called a first pre-charge resistor, and the other resistor may be called a second pre-charge resistor.

One end of the second contactor coil 221 may be electrically connected to the third voltage output line 13, and the other end of the second contactor coil 221 may be electrically connected to the fourth voltage output line 14.

The control unit 400 may output a second control signal to turn on the second contactor 220. In other words, the second control signal induces the second contactor 220 to turn on. The second control signal may be provided to the second contactor coil 221 through the third voltage output line 13 and the fourth voltage output line 14. In detail, the control unit 400 may apply power to the second contactor coil 221 by outputting a voltage of a predetermined level to the third voltage output line 13 and the fourth voltage output line 14, respectively. At this time, the level of the voltage output to one end of the second contactor coil 221 through the third voltage output line 13 may be different from the level of the voltage output to the other end of the second contactor coil 221 through the fourth voltage output line 14. Due to the current flowing through the second contactor coil 221 to which power is applied, the second connector 222 comes to a closed operational position. While the second connector 222 is at the closed operational position, the battery pack 100 and the load 20 may be electrically connected.

The control unit 400 may cut the power supply to the second contactor coil 221 by stopping the output of voltage to at least one of the third voltage output line 13 and the fourth voltage output line 14. If the power supply to the second contactor coil 221 is cut, current does not flow through the second contactor coil 221, and thus the second connector 222 comes to an open operational position. While the second connector 222 is at the open operational position, the battery pack 100 and the load 20 may be electrically disconnected.

Meanwhile, the second contactor 220 may also be called a 'pre-charge contactor'.

The third contactor 230 may include a third contactor coil 231 and a third connector 232. The third contactor 230 may be electrically connected to the battery pack 100 and the load 20 in series. In detail, one end of the third connector 232 may be electrically connected to the second terminal 140 of the battery pack 100 through the electric line 36. In addition, the other end of the third connector 232 may be electrically connected to the second terminal of the capacitor 21a through the electric line 37.

One end of the third contactor coil 231 may be electrically connected to the fifth voltage output line 15, and the other end of the third contactor coil 231 may be electrically connected to the sixth voltage output line 16.

The control unit 400 may output a third control signal to turn on the third contactor 230. In other words, the third control signal induces the third contactor 230 to turn on. The third control signal may be provided to the third contactor coil 231 through the fifth voltage output line 15 and the sixth voltage output line 16. In detail, the control unit 400 may apply power to the third contactor coil 231 by outputting a voltage of a predetermined level to the fifth voltage output line 15 and the sixth voltage output line 16, respectively. At this time, the level of the voltage output to one end of the third contactor coil 231 through the fifth voltage output line 15 may be different from the level of the voltage output to the other end of the third contactor coil 231 through the sixth voltage output line 16. Due to the current flowing through the third contactor coil 231 to which power is applied, the third connector 232 comes to a closed operational position. While the third connector 232 is at the closed operational position, the second terminal of the battery pack 100 and the second terminal of the capacitor 21a may be electrically connected.

The control unit 400 may cut the power supply to the third contactor coil 231 by stopping the output of voltage to at least one of the fifth voltage output line 15 and the sixth voltage output line 16. If the power supply to the third contactor coil 231 is cut, current does not flow through the third contactor coil 231, and thus the third connector 232 comes to an open operational position. While the third connector 232 is at the open operational position, the second terminal of the battery pack 100 and the second terminal of the capacitor 21a may be electrically disconnected.

Meanwhile, the third contactor 230 may also be called a 'ground contactor'.

The driving circuit 10 may supply power, fed from the battery pack 100, to the capacitor 21a by using the current limiting circuit 240 while the first connector 212 is at the open operational position and the second connector 222 and the third connector 232 are at the closed operational position. Accordingly, before the first connector 212 comes to the closed operational position, pre-charge may be performed to the capacitor 21a.

After the capacitor 21a is pre-charged over a target value, the control unit 400 induces the first connector 212 to come to a closed operational position, so that the magnitude of an instant inrush current when the battery pack 100 having a high voltage is electrically connected to the capacitor 21a may be reduced.

As described later, the driving circuit 10 takes charge of basic operations for pre-charging the capacitor 21a included in the inverter 21 in a state where the first contactor 210 is capable of normally operating, and also advantageously maintains electric connection to supply power from the battery pack 100 to the capacitor 21a during an abnormal operation when the first contactor 210 cannot be at the closed operational position, by using the second contactor 220 and the current limiting circuit 240.

Meanwhile, the first contactor 210 may abnormally operate due to various reasons. For example, if the first contactor coil 211 or the first connector 212 of the first contactor 210 is damaged, even though the first control signal is output from the control unit 400, the first connector 212 will not come to the closed operational position. In another example, even though the first contactor coil 211 and the first connector 212 are not damaged, if the first voltage output line 11 or the second voltage output line 12 is disconnected or the first voltage output unit 431 malfunctions, the first connector 212 will not come to the closed operational position.

The voltage measuring circuit 300 may be configured to measure a first voltage V1 and a second voltage V1, respectively. In detail, the first voltage V1 may represent a difference between the potential of the electric line 31 and the potential of a reference point, and the second voltage V2 may represent a difference between the potential of the electric line 32 and the potential of the reference point. In other words, the first voltage V1 may represent a voltage of one of both ends of the first contactor 210, which is connected to the first terminal 130 of the battery pack 100, and the second voltage V2 may represent a voltage of the other of both ends of the first contactor 210, which is connected to the capacitor 21a. In this case, the reference point may be the ground or the second terminal 140 of the battery pack 100.

The voltage measuring circuit 300 may be measure voltages applied to both ends of the first connector 212, based on the first and second voltages V1, V2. For example, the voltage applied to both ends of the first contactor 210 may be identical to V1-V2, which is a difference between the first voltage V1 and the second voltage V2.

The voltage measuring circuit 300 may provide a signal S2, which represents the voltage applied to both ends of the first connector 212, to the control unit 400. Preferably, the signal S2 may have a form of a binary value and be output repeatedly at regular intervals.

If a predetermined condition is satisfied, the control unit 400 may measure the voltage applied to both ends of the first connector 212 by using the voltage measuring circuit 300. Preferably, the control unit 400 may measure the voltage applied to both ends of the first connector 212 by using the voltage measuring circuit 300 at least once while the first control signal is being output.

As described above, the first control signal is a signal for guiding the first contactor 210 to turn on. In other words, the first control signal may correspond to a voltage of a predetermined level, output from the first voltage output line 11 and the second voltage output line 12, respectively. For example, if a driver of the electric vehicle 1 steps on an accelerator pedal, the control unit 400 may output the first control signal.

If the first contactor 210 is capable of normally operating, power is applied to the first contactor coil 211 as a response to the first control signal, and thus the first connector 212 will come to a closed operational position. Meanwhile, if the contactor 210 is not capable of normally operating due to a failure or the like, the first connector 212 will come to an open operational position, even though the first control signal is being output.

While the first control signal is being output, the control unit 400 may determine whether the first contactor 210 is normally operating, based on the voltage at both ends of the first contactor 210 measured by the voltage measuring circuit 300. In an embodiment, if the voltage at both ends of the first connector 212 measured while the first control signal is being output is equal to or higher than a predetermined reference voltage, the control unit 400 may determine that the first contactor 210 is operating abnormally.

If it is determined that the first contactor 210 is operating abnormally, the control unit 400 may stop the output of the first control signal. In addition, the control unit 400 may output a signal for notifying a user that the first contactor 210 is abnormally operating, through a monitor or a speaker provided at the electric vehicle 1.

Meanwhile, if the voltage at both ends of the first connector 212 measured while the first control signal is being output is lower than the reference voltage, the control unit 400 may determine that the first contactor 210 is normally operating. The reference voltage is determined through experiments in advance, and data representing the reference voltage may be stored in the memory 420 in advance.

Figure 3:
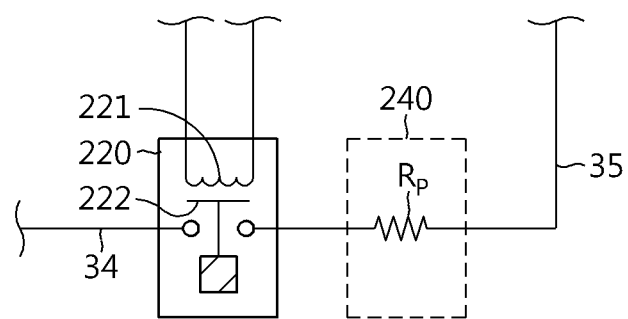
FIG. 3 is a schematic view showing a current limiting circuit according to an embodiment of the present disclosure.

FIG. 3 is a schematic view showing the current limiting circuit 240 according to an embodiment of the present disclosure. For convenience, it is assumed that the third connector 232 depicted in FIG. 2 has a closed operational position.

Referring to FIG. 3, the current limiting circuit 240 may include a resistor $R_P$. In detail, as shown in the figure, one end of the resistor $R_P$ may be electrically connected to the first terminal 130 of the battery pack 100 through the second contactor 220 and the electric line 34. In addition, the other end of the resistor $R_P$ may be electrically connected to the first terminal of the capacitor 21a through the electric line 35.

Preferably, while it is determined that the first contactor 210 is abnormally operating, the control unit 400 may output a second control signal and a third control signal.

By the second control signal, the second connector 222 comes to a closed operational position, and by the third control signal, the third connector 232 comes to a closed operational position. Accordingly, while the first contactor 210 is at the open operational position due to a failure or the like (or, while the first connector 212 is not capable to coming to a closed operational position), the first terminal and the second terminal of the capacitor 21a may be electrically connected to the first terminal 130 and the second terminal 140 of the battery pack 100 through the second connector 222 and the third connector 232, respectively. In other words, while the first contactor 210 is abnormally operating, the power supplied from the battery pack 100 may be supplied to the electric motor 22 through the second contactor 220 instead of the first contactor 210, the resistor $R_P$ and the inverter 20. As a result, the electric vehicle 1 may perform emergency driving.

FIG. 4 is a schematic view showing a current limiting circuit 240 according to another embodiment of the present disclosure.

The current limiting circuit 240 may include a plurality of current limiting units. Hereinafter, for convenience, it is assumed that the current limiting circuit 240 includes two current limiting units 241, 242. Any one current limiting unit included in the current limiting circuit 240 may be electrically connected to the other current limiting unit in parallel.

The first current limiting unit 241 includes a first switch S1 and a first resistor R1. At this time, the first switch S1 and the first resistor R1 are connected to each other in series. In addition, the second current limiting unit 242 includes a second switch S2 and a second resistor R2, similar to the first current limiting unit 241. The second switch S2 and the second resistor R2 are connected to each other in series. In this case, the first switch S1 and the second switch S2 may be a known switching element such as MOFET. Preferably, the resistance of the first resistor R1 may be different from the resistance of the second resistor R2. Hereinafter, it is assumed that the resistance of the first resistor R1 is greater than the resistance of the second resistor R2.

While the first contactor 210 is abnormally operating and the second control signal is being output, the control unit 400 may output a control signal for turning on at least one of the first switch S1 and the second switch S2. In detail, if the control unit 400 outputs a fourth control signal, the first switch S1 may turn on by the fourth control signal. In addition, if the control unit 400 outputs a fifth control signal, the second switch S2 may turn on by the fifth control signal.

The fourth control signal and the fifth control signal may be output simultaneously. In another case, while any one of the fourth control signal and the fifth control signal (for example, the fourth control signal) is being output, the output of the other control signal (for example, the fifth control signal) may be stopped. If the fourth control signal and the fifth control signal are output simultaneously, the first switch S1 and the second switch S2 turn on, and thus the first resistor R1 and the second resistor R2 may be electrically connected in parallel. If the first resistor R1 and the second resistor R2 are electrically connected in parallel, the first resistor R1 and the second resistor R2 may be expressed as a single equivalent resistance. For example, if the first resistor R1 is 3Ω and the second resistor R2 is 1.5Ω, the equivalent resistance obtained by connecting the first resistor R1 and the second resistor R2 in parallel may be 1Ω. As a result, assuming that the other conditions (for example, temperature) are identical, the current flowing through the current limiting circuit 240 may be increased when the fourth control signal and the fifth control signal are output simultaneously, compared with the case where just any one of the fourth control signal and the fifth control signal is output.

Meanwhile, while the first connector 212 is at the open operational position and the second connector 222 is at the closed operational position, the magnitude of current flowing between the battery pack 100 and the capacitor 21a may be changed depending on whether the first terminal 130 of the battery pack 100 and the first terminal of the capacitor 21a are electrically connected by the first resistor R1 or the second resistor R2. Thus, the control unit 400 may determine whether to output the fourth control signal or the fifth control signal, based on the running information provided from the sensing device 2 of the electric vehicle 1.

In an embodiment, if the running speed of the electric vehicle 1 is lower than a reference speed (for example, 10 km/h) at any one time point while the first contactor 210 is determined to be abnormally operating, the control unit 400 may output the fourth control signal together with the second control signal. Because the second connector 222 comes to a closed operational position due to the second control signal and the first switch S1 turns on due to the fourth control signal, the first terminal 130 of the battery pack 100 which is a high potential terminal is electrically connected to the first terminal of the capacitor 21a through the second contactor 220, the first switch S1 and the first resistor R1. Meanwhile, if the running speed of the electric vehicle 1 is higher than the reference speed at any one time point while the first contactor 210 is determined to be abnormally operating, the control unit 400 may output the fifth control signal together with the second control signal. Because the second connector 222 comes to a closed operational position due to the second control signal and the second switch S2 turns on due to the fifth control signal, the first terminal 130 of the battery pack 100 which is a high potential terminal may be electrically connected to the first terminal of the capacitor 21a through the second contactor 220, the second switch S2 and the second resistor R2.

The fact that the running speed of the electric vehicle 1 is lower than the reference speed means that the power demanded to the electric motor 22 is relatively lower in comparison to the case where the running speed is equal to or higher than the reference speed. In this case, since the power from the battery pack 100 is supplied to the inverter 21 through the first resistor R1, the magnitude of current flowing between the battery pack 100 and the capacitor 21a becomes decreased in comparison to the case where the power from the battery pack 100 is supplied to the inverter 21 through the second resistor R2.

In another embodiment, at any one time point while the first contactor 210 is determined to be abnormally operating, it may be determined whether the fourth control signal or the fifth control signal is output, based on a geographic position of the electric vehicle 1. For example, if a distance from the current geographic position of the electric vehicle 1 to a closest repair shop is smaller than a reference distance (for example 40 km), the control unit 400 may output the fourth control signal together with the second control signal. Meanwhile, if the distance from the electric vehicle 1 to a closest repair shop is equal to or greater than the reference distance, the control unit 400 may output the fifth control signal together with the second control signal.

In other words, as the he distance from the electric vehicle 1 to a closest repair shop is relatively shorter, the power demanded to the electric motor 22 is reduced, and thus the battery pack 100 and the capacitor 21a are electrically connected through the first resistor R1, because the first resistor R1 has relatively greater resistance than the second resistor R2. On the contrary, as the he distance from the electric vehicle 1 to a closest repair shop is relatively longer, the power demanded to the electric motor 22 is increased, and thus the battery pack 100 and the capacitor 21a are electrically connected through the second resistor R2 because the second resistor R2 has relatively smaller resistance than the first resistor R1.

Meanwhile, the data representing the distance from a current geographic position of the electric vehicle 1 to a closest repair shop may be calculated by the control unit 400 or provided from the sensing device 2, the MCU or the like of the electric vehicle 1.

In another embodiment, if a body inclination of the electric vehicle 1 is smaller than a reference angle at any one time point while the first contactor 210 is determined to be abnormally operating, the control unit 400 may output the fourth control signal together with the second control signal. In this case, the output of the first control signal and the fifth control signal may be stopped.

Meanwhile, if a body inclination of the electric vehicle 1 is equal to or greater than the reference angle at any one time point while the first contactor 210 is determined to be abnormally operating, the control unit 400 may output the fifth control signal of the second control signal. In this case, the output of the first control signal and the fourth control signal may be stopped.

The fact that the body inclination of the electric vehicle 1 is smaller than the reference angle means that the electric vehicle 1 is running on a gentle road such as a flat land. In other words, if the electric vehicle 1 on a gentle road the power demanded to the electric motor 22 may be relatively lower in comparison to the case where the electric vehicle is running on a steep road. In this case, because the power from the battery pack 100 is supplied to the inverter 21 through the first resistor R1, the magnitude of the current flowing between the battery pack 100 and the capacitor 21a becomes decreased in comparison to the case where the power from the battery pack 100 is supplied to the inverter 21 through the second resistor R2.

Figure 5:
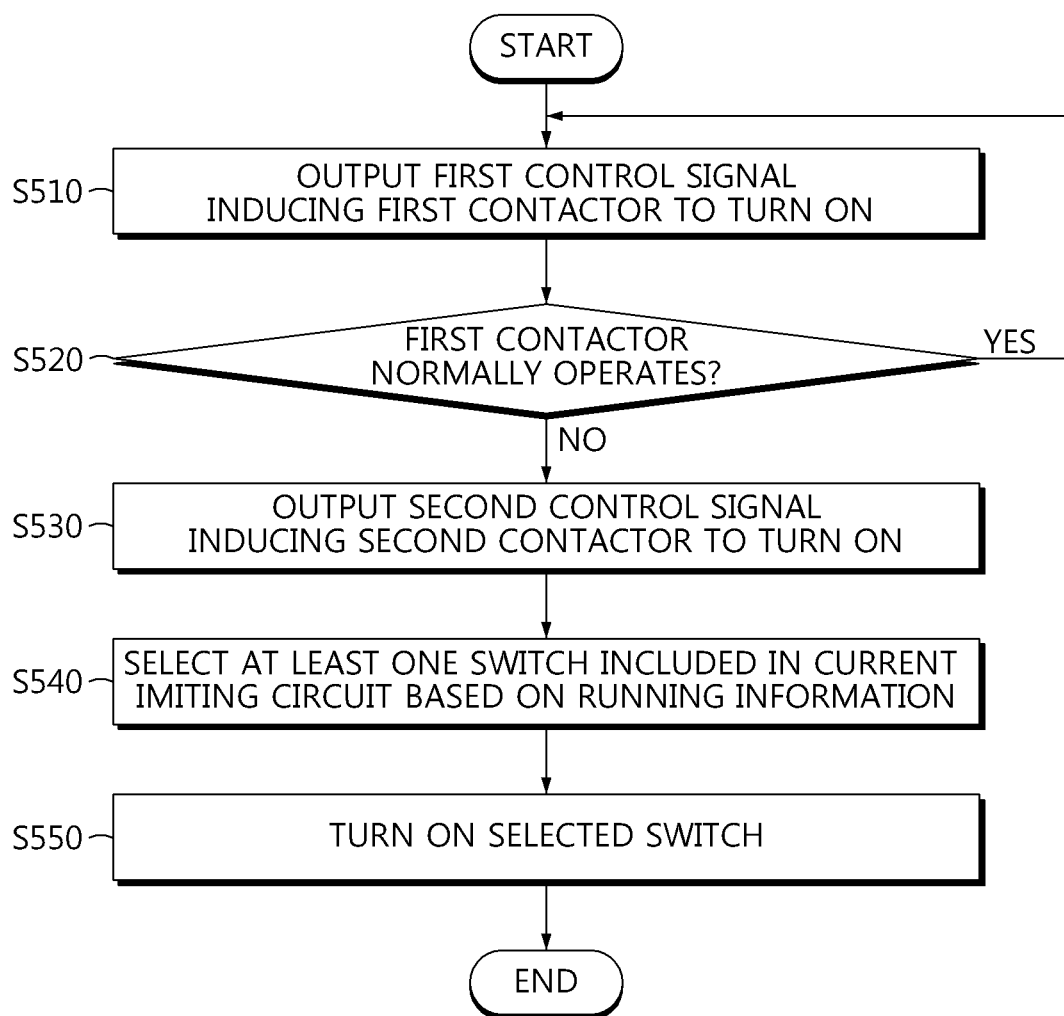
FIG. 5 is a flowchart for illustrating a control method of the driving circuit according to an embodiment of the present disclosure.

FIG. 5 is a flowchart for illustrating a control method of the driving circuit 10 according to an embodiment of the present disclosure. For convenience, it is assumed that the control unit 400 is in a state of outputting the third control signal, namely in a state where the third connector 232 has a closed operational position.

In Step S510, the control unit 400 may output a first control signal. The first control signal is a signal for guiding the first contactor 210 to turn on. For example, the first control signal may be output according to a command of a driver (for example, by stepping on an accelerator pedal). In detail, by using the first voltage output unit 431, the control unit 400 may output a voltage of a first level through the first voltage output line 11 and output a voltage of a second level through the second voltage output line 12.

In Step S520, the control unit 400 may determine whether the first contactor 210 is normally operating while the first control signal is being output through Step S510.

In detail, if the first contactor 210 is normally operating, by means of the first control signal, the first connector 212 comes to a closed operational position, and the voltage at both ends of the first contactor 210 measured by the voltage measuring circuit 300 will be smaller than a reference voltage.

If the voltage at both ends of the first contactor 210 measured while the first control signal is being output is smaller than the reference voltage, the control unit 400 may determine that the first contactor 210 is capable of normally operating. If the voltage at both ends of the first contactor 210 measured while the first control signal is being output is equal to or greater than the reference voltage, the control unit 400 may determine that the first contactor 210 is abnormally operating.

If Step S520 is determined as 'YES', the control unit 400 may return to Step S510. Meanwhile, if Step S520 is determined as 'NO', the control unit 400 may proceed to Step S530.

In Step S530, the control unit 400 may output a second control signal. The second control signal is a signal for guiding the second contactor 220 to turn on. In detail, by using the second voltage output unit 432, the control unit 400 may output a voltage of a third level through the third voltage output line 13 and output a voltage of a fourth level through the fourth voltage output line 14.

The second contactor 220 turning on by the second control signal may electrically connect the battery pack 100 and the load 20. In detail, as the second connector 212 comes to a closed operational position due to the second control signal, the first terminal 130 of the battery pack 100 may be capable of being electrically connected to the first terminal of the capacitor 21a through the second contactor 220 and the current limiting circuit 240.

In an embodiment, as described above with reference to FIG. 4, the current limiting circuit 240 may further include a first current limiting unit 241 and a second current limiting unit 242, connected to each other in parallel. In this case, the method may further include Step S540 and Step S550.

In Step S540, the control unit 440 may select at least one switch included in the current limiting circuit 240, based on the running information of the electric vehicle 1. For example, the control unit 440 may select any one of the first switch S1 and the second switch S2, or select both switches S1, S2. The running information may represent information about the running speed, the geographic position or the body inclination of the electric vehicle 1.

In Step S550, the control unit 440 may turn on the switch selected in Step S540. For example, the control unit 440 may output the fourth control signal when the first switch S1 is selected and may output the fifth control signal when the second switch S2 is selected.

The first switch S1 may turn on by the fourth control signal. In this case, an electric current limited as much as the resistance of the first resistor R1 may be supplied from the battery pack 100 to the inverter 21. The second switch S2 may turn on by the fifth control signal. In this case, an electric current limited as much as the resistance of the second resistor R2 may be supplied from the battery pack 100 to the inverter 21.

Accordingly, the power is supplied from the battery pack 100 to the inverter 20 through the second contactor 220 and the current limiting circuit 240, and the inverter 20 may convert the power supplied from the battery pack 100 into a power demanded to the electric motor 22.

The embodiments of the present disclosure described above are not implemented only by an apparatus and method, but may also be implemented through a program realizing functions corresponding to the configuration of the embodiment of the present disclosure or a recording medium on which the program is recorded. These embodiments may be easily implemented from the embodiments by those skilled in the art.

While the present disclosure has been described by way of embodiments and drawings, the present disclosure is not limited thereto but may be changed and modified in various ways by those skilled in the art within the equivalent scope of the appended claims.

In addition, since the present disclosure described above may be replaced, modified and changed in various ways without departing from the technical idea of the present disclosure by those skilled in the art, the present disclosure is not limited to the above embodiments or the accompanying drawings, but all or some of the embodiments may be selectively combined to make various modifications.

What is claimed is:

1. A driving circuit for an electric vehicle having a battery pack and an inverter, the driving circuit comprising:
    a first contactor connected between a first terminal of the battery pack and a first terminal of a capacitor included in the inverter;
    a second contactor and a current limiting circuit connected to the first contactor in parallel; and
    a control unit configured to control operations of the first contactor and the second contactor,
    wherein the second contactor and the current limiting circuit are connected to each other in series,
    wherein the control unit outputs a first control signal when the first contactor is normally operating and outputs a second control signal when the first contactor is abnormally operating, and
    wherein the first control signal induces the first contactor to turn on, and the second control signal induces the second contactor to turn on,
    wherein the current limiting circuit further includes:
        a first current limiting unit connected to the second contactor in series; and
        a second current limiting unit connected to the first current limiting unit in parallel,
    wherein the first current limiting unit includes a first switch and a first resistor connected to each other in series, and
    wherein the second current limiting unit includes a second switch and a second resistor connected to each other in series.

2. The driving circuit for an electric vehicle according to claim 1, further comprising:
    a third contactor connected between a second terminal of the battery pack and a second terminal of the capacitor,
    wherein the control unit outputs a third control signal together when the first contactor is normally operating, and wherein the third control signal induces the third contactor to turn on.

3. The driving circuit for an electric vehicle according to claim 1,
wherein the control unit stops outputting the first control signal when the first contactor is abnormally operating.

4. The driving circuit for an electric vehicle according to claim 1, further comprising:
a voltage measuring circuit configured to measure voltages at both ends of the first contactor.

5. The driving circuit for an electric vehicle according to claim 4,
wherein the control unit determines whether the first contactor is normally operating, based on the voltages at both ends of the first contactor measured by the voltage measuring circuit, while the first control signal is being output.

6. The driving circuit for an electric vehicle according to claim 1,
wherein resistance of the first resistor is different from resistance of the second resistor.

7. The driving circuit for an electric vehicle according to claim 1,
wherein the control unit turns on at least one of the first switch and the second switch when the first contactor is abnormally operating.

8. The driving circuit for an electric vehicle according to claim 7,
wherein the control unit turns on at least one of the first switch and the second switch based on running information of the electric vehicle.

9. The driving circuit for an electric vehicle according to claim 8,
wherein the running information includes at least one of running speed, geographic position and body inclination of the electric vehicle.

10. The driving circuit for an electric vehicle according to claim 9,
wherein the control unit outputs a fourth control signal together with the second control signal when resistance of the first resistor is greater than resistance of the second resistor and the running speed is lower than a reference speed when the first contactor is abnormally operating, and
wherein the first switch turns on by the fourth control signal.

11. The driving circuit for an electric vehicle according to claim 9,
wherein the control unit outputs a fifth control signal together with the second control signal when resistance of the first resistor is greater than resistance of the second resistor and the running speed is equal to or higher than a reference speed when the first contactor is abnormally operating, and
wherein the second switch turns on by he fifth control signal.

12. electric vehicle, comprising a driving circuit for an electric vehicle defined in claim 1.

13. A control method of a driving circuit for an electric vehicle defined in claim 1, the control method comprising:
by the control unit, outputting a first control signal;
by the control unit, determining whether the first contactor is abnormally operating while the first control signal is being output;
by the control unit, outputting the second control signal while it is determined that the first contactor is abnormally operating; and
turning on the second contactor by the second control signal to electrically connect the first terminal of the battery pack and the first terminal of the capacitor.

* * * * *